(12) United States Patent
Kwon et al.

(10) Patent No.: US 6,269,050 B1
(45) Date of Patent: Jul. 31, 2001

(54) INTERNAL CLOCK GENERATING CIRCUIT OF SYNCHRONOUS TYPE SEMICONDUCTOR MEMORY DEVICE AND METHOD THEREOF

(75) Inventors: Kook-Hwan Kwon, Suwon; Yong-Hwan Noh, Kwachon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/594,888

(22) Filed: Jun. 14, 2000

(30) Foreign Application Priority Data

Jun. 15, 1999 (KR) .................................................. 99-22202

(51) Int. Cl.⁷ ..................................................... G11C 8/00
(52) U.S. Cl. ............................................ 365/233; 365/194
(58) Field of Search ...................................... 365/233, 194

(56) References Cited

U.S. PATENT DOCUMENTS 5,808,961 * 9/1998 Sawada ................................ 365/233

* cited by examiner

*Primary Examiner*—David Nelms
*Assistant Examiner*—M. Tran
(74) *Attorney, Agent, or Firm*—Marger Johnson & McCollom, P.C.

(57) ABSTRACT

An internal clock generating circuit of a synchronous type semiconductor memory device includes a transmission part for transmitting a first clock enable signal in response to applying a first level of a first clock signal. It also includes a latch part for latching the first clock enable signal transmitted from the transmission part. A gating part gates the latched first clock enable signal with the first clock signal to generate a second clock signal as an internal clock signal for the memory device. This reduces a time lag by which the speed of the internal clock is synchronized with the external clock signal.

24 Claims, 4 Drawing Sheets

INTERNAL CLOCK GENERATING CIRCUIT OF SYNCHRONOUS TYPE SEMICONDUCTOR MEMORY DEVICE AND METHOD THEREOF

CROSS REFERENCE TO RELATED APPLICATIONS

This application claims priority from Korean Priority Document No. 99-22202, filed on Jun. 15, 1999 with the Korean Industrial Property Office, which document is hereby incorporated by reference.

BACKGROUND OF THE INVENTION

1. Field of the Invention

The present invention relates to semiconductor memory device, and more particularly to an internal clock generating circuit in a synchronous type semiconductor memory device that generates an internal clock signal by synchronizing with an external clock signal applied from outside.

2. Brief Description of the Prior Art

In recent years, a microprocessor performs operations at high speed, for instance, from 100 MHz to hundreds of MHz. Dynamic semiconductor memory devices for main computer memories and the like, and static semiconductor memory devices for cache memories have been developed, to increase storage capacity and improve operational speed in response to users' demands. However, the operational speed of the semiconductor memory devices can not keep up with that of microprocessors. As a result, the microprocessor has to be held back at its stand-by state, while the semiconductor memory device performs an access operation to collect necessary data. As a result, the operational speed of the relatively slow processing semiconductor memory device determines the performance of an entire system to which the device is applied, and hampers efforts for improving the performance of the system.

In order to improve the performance of the system by reducing the difference in operational speed between the semiconductor memory device and the microprocessor, a synchronous type semiconductor memory device has been used for inputting and outputting data, by synchronizing with an external clock signal applied from outside. The synchronous type semiconductor memory device receives control signals, such as commands applied from outside by synchronizing with the external clock signal, and performs internal operations for inputting and outputting data by synchronizing with the clock signal. The data is inputted in response to the external clock signal, thereby enabling to transmit data at a high speed. Furthermore, since the control signals applied from outside are received by synchronizing with the clock signal, a timing to start internal operations can be determined by only an edge of the clock signal, without considering a margin caused by a skew between signals applied from outside. As a result, it can be possible to make an accessing operation at high speed.

For instance, a signal input system of a typical synchronous time semiconductor memory device such as a dynamic random access memory DRAM has been introduced in Japan Patent Application Laid Open No. 8-180677. In the aforementioned system, an internal signal is generated on basis of a reference clock signal applied from outside and a clock enable signal to enable or disable the reference clock signal. Operations of other circuits in the semiconductor memory device are synchronized with the internal clock signal and other clock signals relevantly generated by the internal clock signal.

On the other hand, Japanese Patent Application Laid Open No. 8-17182 has disclosed a method of generating internal command signals to determine internal operations of the memory by processing command signals applied from outside. However, the circuits of the aforementioned synchronous type semiconductor memory device can not latch external command signals until an internal clock signal is generated. In this regard, all operations after decoding commands are affected by the time lag generated in the internal clock generating circuit. In consequence, the access speed of the synchronous type semiconductor memory device may drop.

As described above, in the conventional synchronous type semiconductor memory device which receives command signals by synchronizing with an external clock signal applied from outside and performs internal operations to input and output data by synchronizing with the external clock signal, the access speed thereof has not been satisfactory to users. This is because there has been a stand-by cycle between read and write operations, or between write and read operations.

There has been a demand for a synchronous type semiconductor memory device, which can perform operations at super high speed without the stand-by cycle. In response to such users' demand, there was made a memory in which an external clock signal applied through a clock input pin is controlled at every clock switching cycle by an external clock enable signal applied through a clock enable pin. In order to improve the access speed, such synchronous type of memory does not include a dummy cycle between read and write cycles.

Therefore, it has been named as "Notum-around type RAM (NtRAM) or "zero-bus turnaround type RAM (ZBtRAM)". In the synchronous type of memory in which a dummy cycle or a stand-by cycle, the clock enable operation is performed at every cycle as soon as the external clock shifts high from its low level with the clock enable signal being kept at its low level, and a clock disable operation is performed as soon as the external clock shifts from its low level to its high level with the clock enable signal being kept at its high level. If the external clock is controlled at its disable state by the level of the clock enable signal, the memory should generate an internal clock without a clock shifting interval. If the clock enable signal applied at the aforementioned clock controlling operations is not controlled again by the clock signal, there will be no further problem. However, if the clock enable signal is influenced by the clock signal on determining a margin between setup time and hold time in the chip, there can be a time lag in the internal clock to be generated. In other words, the external clock enable signal to determine enable or disable of the external clock is synchronously controlled by the external clock signal to determine the internal margin between setup time and hold time of the clock enable signal. Then the internal clock enable signal thus generated determines enable and disable of the external clock signal, thereby performing the operations to generate the internal clock. As a result, the time that the internal clock is generated will be delayed by the time lag before the actual operations are related thereto. As described above, the time lag that occurred at the time of generating the internal clock slows down the data access speed of the semiconductor memory device, to thereby lower the entire functional capacity of the device. Therefore, in the synchronous type semiconductor memory device which performs data access operations by receiving the clock signal and the clock enable signal applied from outside, there is a need for developing a technique of generating an internal clock at minimum time lag in response to the external clock signal applied from outside.

SUMMARY OF THE INVENTION

Therefore, it is an object of the present invention to provide a synchronous type semiconductor memory device with an internal clock generating circuit that generates an internal clock generating circuit synchronous to the external clock signal, but with reduced time lag in so generating.

In order to accomplish this object, the present invention provides an internal clock generating circuit of a synchronous type semiconductor memory device that includes a transmission part, for transmitting the external clock enable signal in response to applying a first level of the external clock signal. A latch part latches the external clock enable signal that is transmitted from the transmission part. A gating part combines the latched external clock enable signal with an external clock signal, to generate a second clock signal as the internal clock signal.

The invention provides an internal clock by receiving a first clock signal and a first enable signal from outside. The method includes passing and outputting the first clock enable signal as a second clock enable signal while the first clock signal is at a first level. In addition, it includes latching and continuously outputting the second clock enable signal while the first clock signal is at a second level different from the first level. Plus, generating the internal clock by combining the latched second clock enable signal with the first clock signal.

According to the circuit, while the first clock signal is kept at its first state, an internal clock is generated by gating the output of the latch part outputted by transmission of the first clock enable signal with the first clock signal. On the other hand, if the first clock signal is shifted to its second state, the internal clock is generated by keeping the previously received logic state of the first clock enable signal to determine an internal margin between setup time and hold time of the clock enable signal and, at the same time, logically gate the formerly maintained logic state and the first clock signal. In consequence, the time lag in generating the internal clock is minimized or reduced. In other words, the clock enable signal is received early at a predetermined interval and an internal clock generating path is minimized for the aforementioned effects.

DETAILED DESCRIPTION OF THE PRESENT INVENTION

Figure 1:
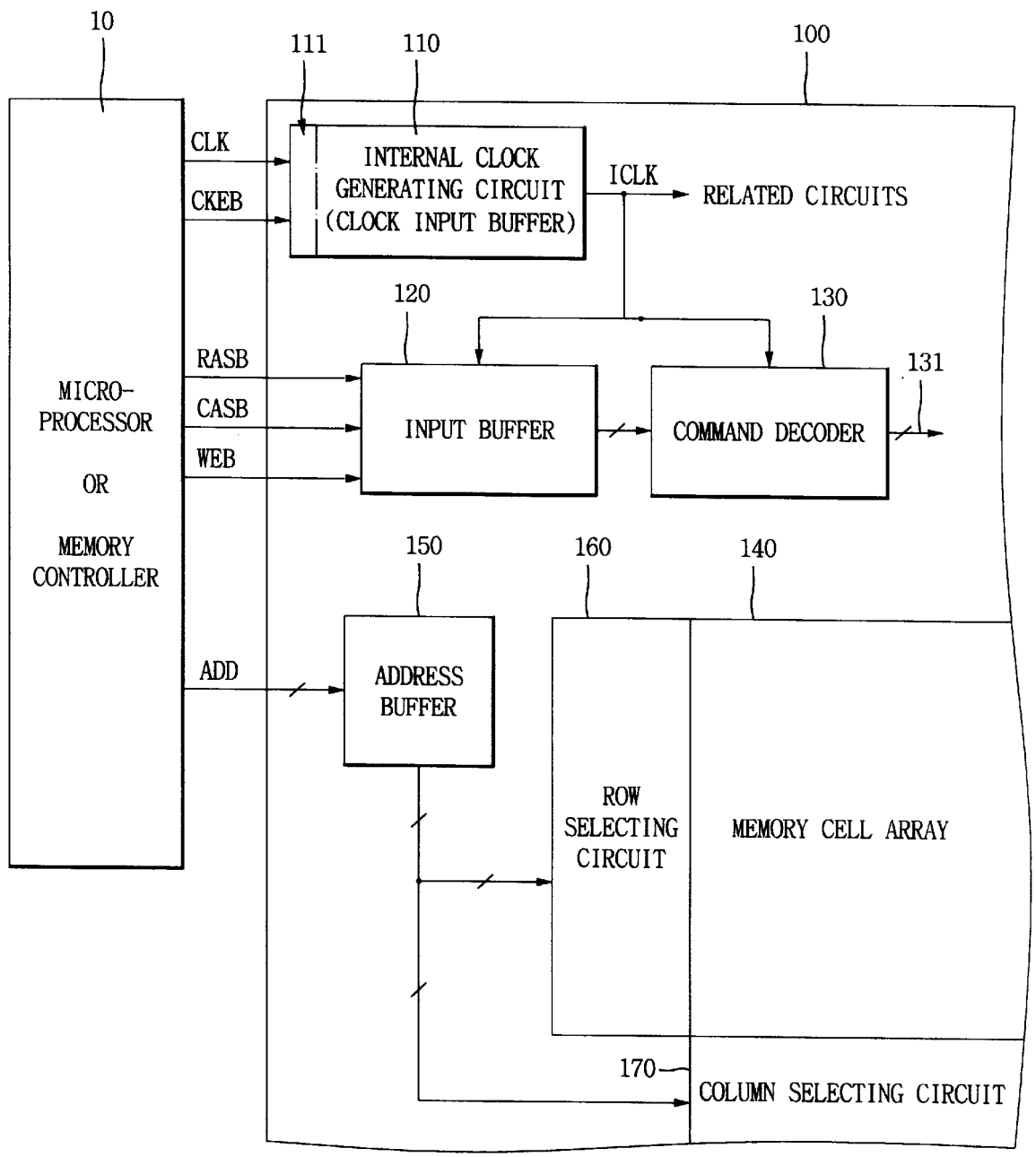
FIG. 1 is a schematic diagram for illustrating an entire structure of a prior art synchronous type semiconductor memory device with an internal clock generating circuit.

The objects and special features of the present invention will be described in detail with reference to accompanying drawings, and better defined by describing preferred embodiments. It should be noted that the same and similar parts in the drawings will be indicated with the same reference numerals for convenient description and understanding.

FIG. 1 is presented as an embodiment possible to describe applications of the present invention, schematically illustrating the entire structure of a general synchronous type of a semiconductor memory device along with an external device 10. As shown in the drawings, a clock signal CLK transmitted from commonly known microprocessor or memory controller 10 positioned outside, a clock enable signal CKEB, a row address strobe signal RASB, a column address strobe signal CASB, a write enable signal WEB, and an address signal are applied through an external input pin installed at the chip of the synchronous type semiconductor memory device 100. At this time, external commands or external control signals including row address strobe signal RASB, column address strobe signal CASB and write enable signal WEB are applied to an input buffer 120 of the device 100, and clock signal CLK and clock enable signal CKEB necessary to generate an internal clock of the chip are applied to an internal clock generating circuit 110 called a clock input buffer of the device 100.

The internal clock generating circuit 110 performs a buffering operation of transforming the clock signal CLK into an CMOS level therein, and generates an internal clock signal ICLK along with the received clock signal CLK and clock enable signal CKEB. The internal clock ICLK is a clock needed to perform, so called, data access operations like to write data in memory cells of the memory cell array 140, and to read data out of the memory cell array 140 by synchronizing with the externally inputted clock signal CLK. The internal clock ICLK is transmitted to input buffer 120, command decoder 130, address buffer 150, and row and column relating circuits (not shown) where outputs of command decoder 130 are inputted through a line 131. Then, all the internal operations are respectively performed by synchronizing with the internal clock ICLK. Outputs of the row relating circuits are applied to a row selecting circuit 160, which selects a memory cell connected to the same row out of the memory cells arranged in the memory cell array 140. Outputs of the column relating circuits are applied to a column selecting circuit 170, which selects a memory cell connected to the same column out of the memory cells arranged in the memory cell array 140. An address to designate a memory cell to make an access is applied as a row and column address through the address buffer 150 to the row selecting circuit 160 and the row selecting circuit 170 therefore, it can be known that the internal clock ICLK is very important to be standard for the internal operations of the memory device, and it is preferable that the internal clock ICLK should be applied with a minimum time lag from an external clock to improve performance of the device. Circuits that access data stored in the memory cell array 140 are also known as control circuits.

Figure 2:
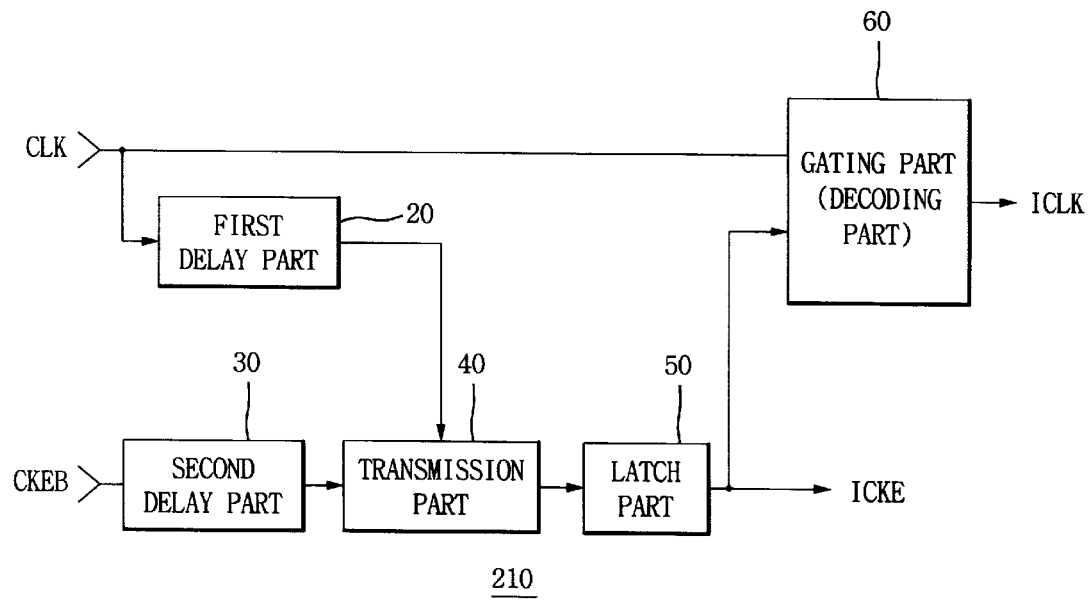
FIG. 2 is a block diagram for illustrating an internal clock generating circuit in accordance with an embodiment of the present invention.

FIG. 2 is a block diagram for illustrating an internal clock generating circuit 210 in accordance with an embodiment of the present invention, which can also be applied to circuit 110 of FIG. 1. In other words, the invention encompasses the circuit of FIG. 1, by substituting circuit 210 of FIG. 2 for block 110 of FIG. 1.

The circuit 210 includes an optional first delay part 20, an optional second delay part 30, a transmission part 40, an optional latch part 50 and a gating part 60. The first delay part 20 and the second delay part 30 respectively receive the external clock signal CLK and the clock enable signal CKEB, to delay operations for shifting levels or adjusting a skew between signals, and to output the resultant signals to the transmission part 40. The transmission part 40 transmits the first clock enable signal to the latch part 50, in response to the first state of the first clock signal, for instance, logic low level, and blocks the first clock enable signal in response to the second state of the first clock signal, e.g. logic high level. The latch part 50 outputs the first clock enable signal transmitted from the transmission part 40 as a second clock enable signal ICKE, latches the second clock enable signal ICKE with the first clock signal CLK being maintained at its second state, and provides it to the gating part 60. The gating part 60, also called a decoding part, decodes the second clock enable signal ICKE and the first clock signal CLK outputted from the latch part 50, to thereby generate a second clock signal ICLK as an internal clock.

Figure 3:
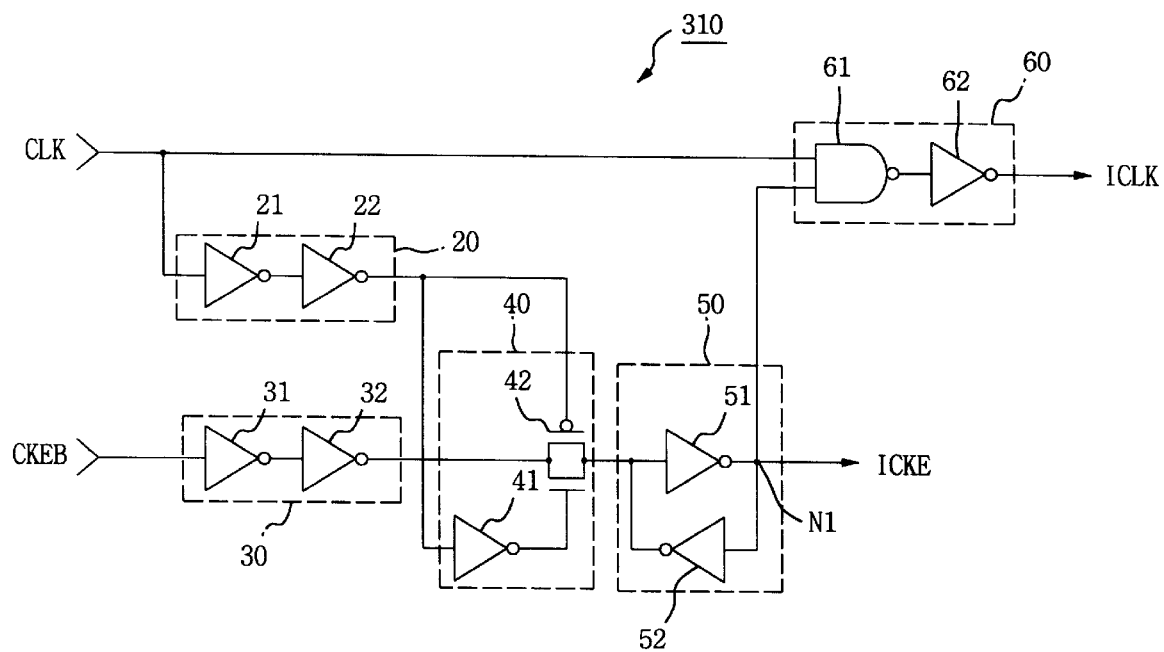
FIG. 3 is a circuit diagram for illustrating a first embodiment of FIG. 2.

FIG. 3 is a circuit diagram 310 for illustrating a first embodiment of FIG. 2. In the embodiment, inverters 21, 22 relate to the first delay part 20, and inverters 31, 32 relate to the second delay part 30. The CMOS type of transmission gate 42 and inverter 41 relate to the transmission part 40, constructed with a combination of n-channel MOSFET and p-channel MOSFET. Cross-coupled inverters 51, 52 relate to the latch part 50, and NAND gate 60 and inverter 62 relate to the gating part 60.

Figure 4:
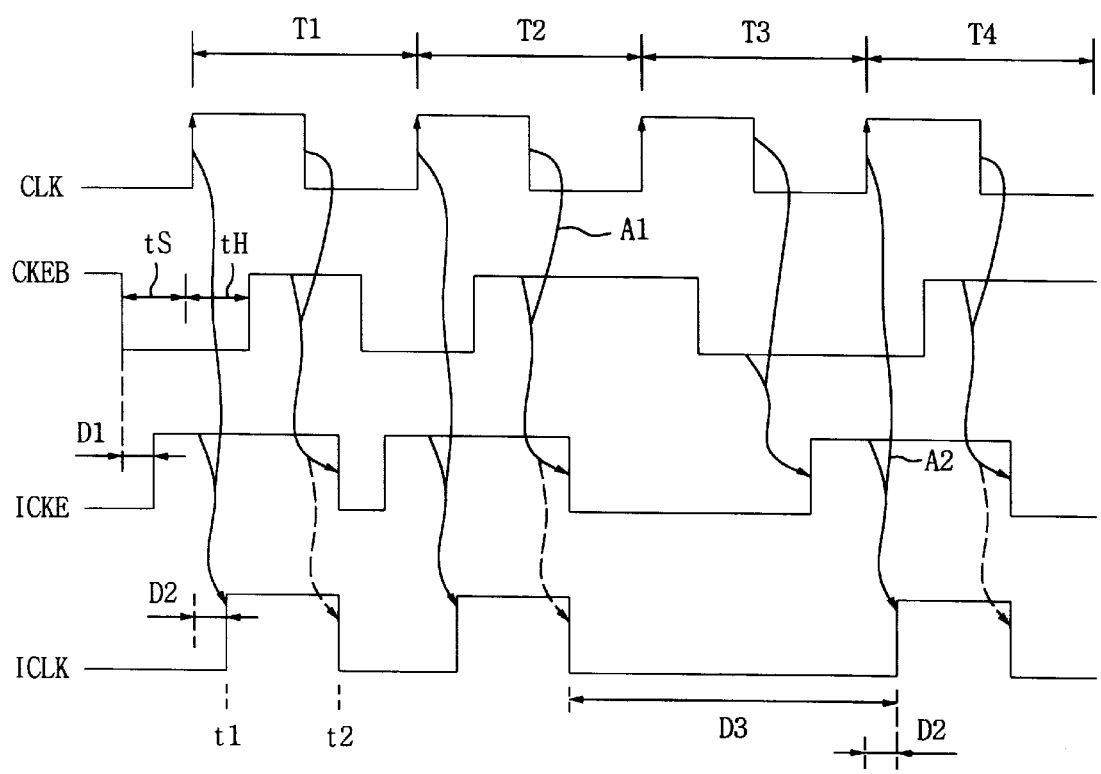
FIG. 4 is a wave timing diagram for illustrating operations of the circuit of FIG. 3.

FIG. 4 is a wave timing diagram for illustrating operations of the circuit 310 in FIG. 3. The clock signal CLK and the clock enable signal CKEB in the circuit of FIG. 3 are applied from outside of the device 100, in wave shaping signals CLK and CKEB in FIG. 4. According to the transmitted state, high or low level, of the clock enable signal CKEB, the enable or disable operations of clock signal CLK will be determined within one cycle of the clock signal CLK.

When the low level of the clock signal CLK is switched to its high level with the clock enable signal CKEB being kept at its low level, the enable interval can be kept for the one cycle. Therefore, intervals T1, T2 and T4 are determined as enable intervals, and interval T3 is determined as a disable interval. In consequence, the externally positioned microprocessor or memory controller 10 determines a timing suitable for applying two signals, clock signal CLK and clock enable signal CKEB.

In FIG. 3, if the clock enable signal CKEB is applied at its low level with the clock signal CLK being kept at its low level, it relates to a step prior to the step where intervals T1, T2 or T4 in FIG. 4 start. If it is taken as the time prior to the beginning of the interval T1, the transmission gate 42 turns on to transmit the clock enable signal CKEB applied at its low level through the transmission gate 42 to the input of the inverter 51. Therefore, the output of the inverter 51 of the latch part 50 gets to its high level, which is shown as an internal clock enable signal ICKE at a node Ni. The high level of the internal clock enable signal ICKE is applied as an input to the other side of the NAND gate 61 and to the inverter 52 of the latch part 50 at the same time, so that the output of the inverter 51 is latched at the high state of the signal. The NAND gate 61 outputs at the high state of the signal, regardless of the logic of the input at the other side thereof, because the clock signal CLK is at its low level. As a result, the output of the inverter 62 turns to its low level, so that the logic state of the internal clock signal ICLK turns low at the step prior to the beginning of the interval T1.

When the clock signal CLK shifts to its low level to its high level, the transmission gate 42 turns off. Then, the clock enable signal CKEB does not pass through the transmission gate 42, but gets blocked. In this case, the output of the inverter 51, that is, the internal clock enable signal ICKE, is kept at its high level by the latching operation of the latch part 50. On the other hand, the inverters 21, 23, 31, 32 play roles as level shifters or buffers, having a function of delaying signals at about 0.1 to several nanoseconds by adding or subtracting a period of time to adjust the skew between the applied signals.

The clock signal CLK shifts from its low level to its high level by operations of the circuit elements to thereby determine the chip internal margin between setup time (tS) and hold time (tH) of the clock enable signal CKEB. In other words, the setup time (tS) and hold time (tH) of the clock enable signal CKEB are given by specifications provided from outside, but those of the internal clock enable signal ICKE are determined by the operations of the internal clock generating circuit 310.

When the clock signal CLK shifts to its high level, the NAND gating operation is performed at the time when the clock signal CLK shifts to its high level, because the NAND gate 61 of the gating part 60 has already been set at its high state by the input of the other side. In consequence, reception of the signal will be delayed at the gating step where the internal clock ICLK is generated. The output of the NAND gate 61 immediately turns low from its high state, and the output of the inverter 62 turns high. The internal clock ICLK to be generated shifts high at the time t1, which is known to phase-lock the external clock signal CLK at a minimum delay D2. The delay D2 has almost the same period of time as the delay D1 of the wave shaping signal CKEB in FIG. 4. The delay D1 is a delay in passage resulting from the signal path of inverters 31, 32, transmission gate 42 and inverter 51 in sequence. The delay D1 can be minimized if there is no need to adjust the skew of signals. Therefore, the internal clock ICLK is generated synchronously with the external clock signal CLK, at a time delay only caused by the signal path. If the clock signal CLK shifts and maintains high, the transmission gate 42 is kept off, even if the state of the clock enable signal CKEB applied from outside may change, and the internal clock enable signal ICKE is continuously kept at its high level. As a result, the internal clock ICLK is kept high up to the time t2.

During the interval in FIG. 4, while the clock signal CLK shifts low from its high state, regardless of the state of the internal clock enable signal ICKE, the NAND gate 61 outputs its high level, and the internal clock ICLK shifts low from its high state by the inverter 62. At the same time, the transmission gate 42 turns on. The clock enable signal CKEB kept at its level passes through the transmission gate 42, and latches at the latch part 50. At this time, the clock enable signal CKEB is at its high level, so that the internal clock enable signal ICKE shifts to its low state, as shown in the wave shaping signal ICKE in FIG. 4. Thus, even if the state of the internal clock enable signal ICKE has changed different from the prior one, the NAND gate 61 continuously outputs a high level thereof. As a result, the internal clock ICLK is kept at its low state, up to the beginning of the interval T2.

According to the aforementioned operations, it can be known that the internal clock ICLK is generated in response to the external clock signal CLK by performing an immediate phase-lock only with the signal path delay D2, without any response delay, at the enable intervals T1, T2 and T4.

On the other hand, a disable operation, at which the clock enable signal CKEB is applied at its high state at the time when the clock signal CLK shifts from its low state to its high state, will be described below. Even if the clock signal CLK shifts from its low state to its high state or vice versa at the disable interval T3, the internal clock ICLK to be generated should be kept at its designated logic state without a shifting interval, that is, at its low state during the interval D3 in FIG. 4. Now, it will be described below the way that the internal clock ICLK to be generated can be kept by a predetermined operation at its low state during the interval D3, that is during the disable interval described above, with the aforementioned characteristic of speedy response.

First of all, at a timing point A1 in the enable interval T2, a prior interval to the disable interval T3, the clock signal CLK is applied at its low state, and the clock enable signal CKEB is applied at its high state, so that the transmission gate 42 turns on to pass the clock enable signal CKEB applied at its high state through the transmission gate 42 to the input of the inverter 51. Therefore, the output of the inverter 51 constructing the latch part 50 turns to its low state, which will be shown as the internal clock enable signal ICKE at the node N1. As a result, of the internal clock ICLK outputted from the inverter 62 of the gating part 60 turns to its low state.

At the beginning of the disable interval T3 the clock signal CLK shifts to its high state, so that the transmission gate 42 turns off. As a result, the output of the inverter 51 in the latch part 50, which performs a latching operation, that is the logic level of the internal clock enable signal ICKE, is set at its low state. The clock signal CLK shifts from its low state to its high state with the aforementioned operations, thereby determining the chip internal margin between setup time tS and hold time tH of the clock enable signal CKEB. At the beginning timing point of the interval T3, the NAND gate 61 of gating part 60 is set with a low level of the internal clock enable signal ICKE being applied at the other side thereof, so the NAND gate 61 is kept at its high state, even if the clock signal CLK changes to its high state. In consequence, the internal clock ICLK, that is the output of the inverter 62, is continuously kept at its low state. As long as the clock signal CLK shifts and maintains its high state, the transmission gate 42 is kept at its off state, and the internal clock enable signal ICKE is still kept at its low state, in spite of any changing state of the clock enable signal CKEB applied from outside.

When the clock signal CLK shifts to its low state again within the interval T3, the internal clock ICLK, that is the output of the inverter 62, is kept at its low state as shown in FIG. 4. As the clock enable signal CKEB, applied at the time when the clock signal CLK shifts to its low state, is at its low state, the internal clock enable signal ICKE turns to its high state. Even if the internal clock enable signal ICKE changes to its high state, the internal clock ICLK is kept at its low state up to the beginning point of the interval T4, because the clock signal CLK has already been applied at its low state. As a result, the internal clock ICLK is kept at its low state during the interval T3 without any shifts, so that the external clock disable operations initiated by the clock enable signal has been achieved.

According to the circuit 310 in FIG. 3, the internal clock ICLK can be generated with a minimized path much faster than in the case where the latch part is instead constructed with 2 levels. As shown above, the clock enable signal CKEB is received earlier at the predetermined interval with a minimum path of generating the internal clock, thereby reducing or minimizing the timing delay for generating the internal clock.

Figure 5:
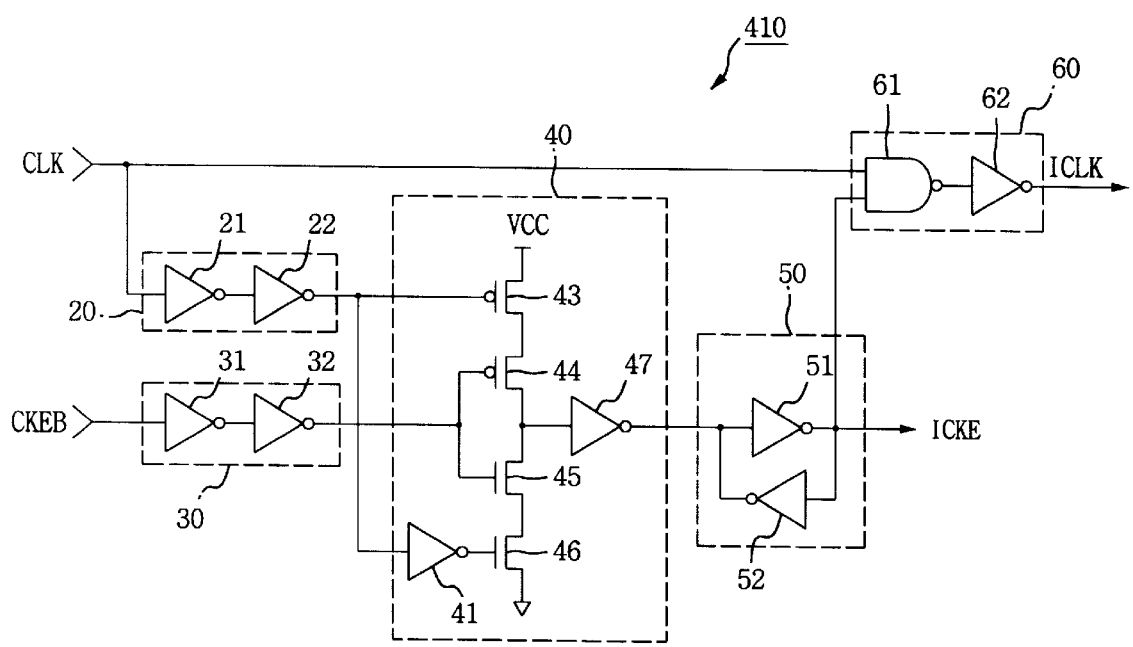
FIG. 5 is a circuit diagram for illustrating a second embodiment of FIG. 2.

FIG. 5 is a diagram of a circuit 410 for illustrating a second embodiment of the circuit of FIG. 2. The circuit 410 of FIG. 5 is constructed in the same way as that of FIG. 3, except for the transmission part 40. In other words, the transmission part 40 shown in FIG. 5 is constructed with clocked inverters, having two P and two N channel transistors 43, 44, 45, 46. Therefore, in this case, the phases of the input signals are inverted and outputted, which is why a phase inverting inverter 47 is added at the output end of the clocked inverters 43–46 to imitate the operational logic of circuit 310 of FIG. 3. The wave timing to show operations in FIG. 5 is also shown in FIG. 4. Referring to the wave timing in FIG. 4, the operations of the internal clock generating circuit 410 in FIG. 5 can be understood to be the same in practice as those in FIG. 3.

Figure 6:
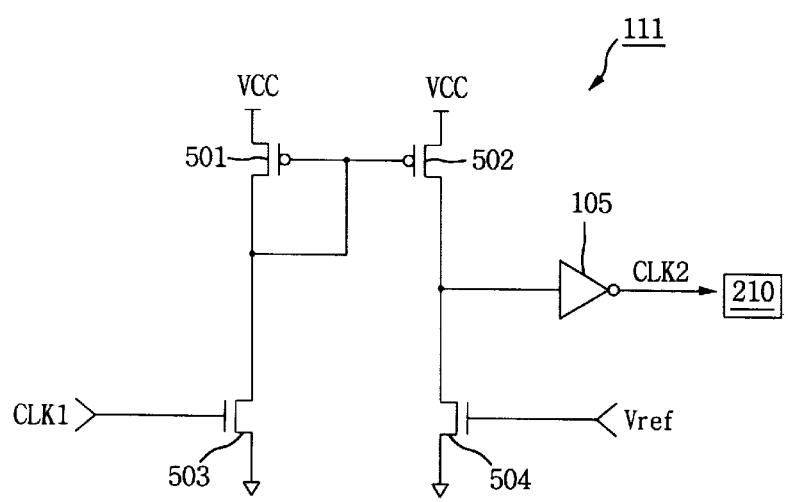
FIG. 6 is a circuit diagram for illustrating an embodiment of an optional signal level switching clock buffer applicable to the front end of the internal clock generating circuit of FIG. 2.

FIG. 6 is a perspective circuit diagram for illustrating an embodiment of the signal level changing clock buffer 11, which can be optionally applied to the front end of the internal clock generating circuit 110 in FIG. 1. The structure and detailed operational principles are disclosed in FIG. 7 of U.S. Pat. No. 5,898,331, which is hereby incorporated by reference. In FIG. 6 of this description, the TTL or LVTTL level of the first clock signal CLK1 applied from outside is changed into a level requested by the internal chip, such as a CMOS level, by operations of a current-mirror circuit, to output through an inverter 105 as a second clock signal CLK2, which is input as the CLK signal to circuit 210. In addition, the clock buffer 111 in FIG. 6 requires a reference voltage Vref, so that the first and second delay parts 20, 30 in FIG. 2 are manufactured with a level shifting function. Therefore, the clock buffer 111 does not need to be installed therein.

Having described specific preferred embodiments of the invention with reference to the accompanying drawings, it is to be understood that the invention is not limited to those precise embodiments, and that various changes and modifications maybe effected therein by one skilled in the art without departing from the scope of spirit of the invention as defined in the appended claims. For instance, it is possible to increase or decrease the number of delay units in the delay part, have a different structure of the transmission part, replace latching inverters of the latch part or flip-flop elements, change the gating logic of the gating part, or increase or decrease the number of the gates.

Therefore, there are advantages in the internal clock generating circuit of the present invention in that the time delay caused in generating an internal clock in the synchronous type semiconductor memory device, can be minimized or reduced, thereby increase the speed of the data access operations, and improving the performance of the synchronous type semiconductor memory device.

What is claimed is:

1. An internal clock generating circuit of a synchronous type semiconductor memory device comprising:
    a transmission part for transmitting a first clock enable signal in response to applying a first level of a first clock signal;
    a latch part for latching the first clock enable signal transmitted from the transmission part; and
    a gating part for gating the latched first clock enable signal with the first clock signal to generate a second clock signal as an internal clock signal for the memory device.

2. The circuit of claim 1, further comprising:
    a first delay part for delaying the response of the transmission part with respect to applying the first level of the first clock signal.

3. The circuit of claim 1, further comprising:
a second delay part for delaying the first clock enable signal from reaching the transmission part.

4. The circuit of claim 1, wherein the first clock signal and the first clock enable signal are signals applied from outside of the semiconductor memory device.

5. The circuit of claim 1, wherein the transmission part is a transmission gate constructed with CMOS transistors to transmit the first clock enable signal without reduction in the level of the signal.

6. The circuit of claim 1, wherein the latch part is constructed with cross-coupled inverter latches.

7. The circuit of claim 1, wherein the gating part is constructed with at least one NAND gates to generate an AND type response.

8. The circuit of claim 1, wherein the gating part is constructed with at least one NAND gates to generate a NAND type response.

9. The circuit of claim 1, wherein the synchronous type semiconductor memory device is a static random access memory processing without a dummy cycle between read and write operations.

10. The circuit of claim 9, wherein the memory device processes at high speed.

11. The circuit of claim 1, wherein the second clock signal is generated by delaying and synchronizing with the first clock signal, without clock shifting at an interval where the first clock signal is disabled according to the level of the first clock enable signal.

12. The circuit of claim 1, wherein the first clock signal and the first clock enable signal are input from buffers positioned inside the semiconductor memory device to shift levels of signals applied from outside.

13. The circuit of claim 1, wherein the transmission part includes a clocked CMOS inverter for phase-inverting and transmitting the first clock enable signal without loss in its level status.

14. The circuit of claim 1, further comprising:
a level shifting unit.

15. A synchronous type semiconductor device comprising:
at least one memory cell array;
at least one control circuit for accessing data stored in the memory cell array;
an internal clock generating circuit for generating an internal clock signal to control the control circuit, wherein the internal clock generating circuit includes
a transmission part for transmitting the first clock enable signal in response to applying a first level of the first clock signal,
a latch part for latching the first clock enable signal transmitted from the transmission part, and
a gating part for gating the latched first clock enable signal with the first clock signal to generate a second clock signal as the internal clock signal.

16. The device of claim 15, wherein the internal clock generating circuit further includes
a first delay part for delaying the response of the transmission part with respect to applying the first level of the first clock signal.

17. The device of claim 15, wherein the internal clock generating circuit further includes
a second delay part for delaying the first clock enable signal from reaching the transmission part.

18. A method of generating an internal clock by receiving a first clock signal and a first enable signal from outside comprising:
passing and outputting the first clock enable signal as a second clock enable signal while the first clock signal is at a first level,
latching and continuously outputting the second clock enable signal while the first clock signal is at a second level different from the first level; and
generating the internal clock by combining the latched second clock enable signal with the first clock signal.

19. The method of claim 18, wherein combining is performed by an AND gate.

20. The method of claim 18, wherein combining is performed by a NAND gate.

21. The method of claim 18, wherein the second clock enable signal is latched by cross-coupled inverters.

22. The method of claim 18, wherein the internal clock is generated by delaying and synchronizing with the first clock signal, without clock shifting at an interval where the first clock signal is disabled according to a level of the first enable signal.

23. The method of claim 18, for use in a static random access memory device processing at high speed without a dummy cycle between read and write operations, wherein the internal clock signal is used to synchronize control circuits of the memory device.

24. The method of claim 23, wherein the first clock signal and the first enable signal are input from buffers positioned inside the memory device to shift levels of signals applied from outside the device.

* * * * *

UNITED STATES PATENT AND TRADEMARK OFFICE
CERTIFICATE OF CORRECTION

PATENT NO.   : 6,269,050 B1
DATED        : July 31, 2001
INVENTOR(S)  : Kwon et al.

It is certified that error appears in the above-identified patent and that said Letters Patent is hereby corrected as shown below:

Column 2,
Line 32, "Notum-around" should read -- Noturn-around --.

Column 4,
Line 50, "170 therefore," should read -- 170. Therefore, --.

Column 5,
Line 53, "node Ni." should read -- node N1. --.

Column 8,
Line 15, "clock buffer 11, which" should read -- clock buffer 111, which --.

Signed and Sealed this

Seventh Day of May, 2002

*Attest:*

*Attesting Officer*

JAMES E. ROGAN
*Director of the United States Patent and Trademark Office*